US008990491B1

(12) United States Patent
Xu

(10) Patent No.: US 8,990,491 B1
(45) Date of Patent: Mar. 24, 2015

(54) EYE SCAN FOR ASYMMETRIC SHAPED COMMUNICATION SIGNAL

(71) Applicant: Inphi Corporation, Santa Clara, CA (US)

(72) Inventor: Chao Xu, Thousand Oaks, CA (US)

(73) Assignee: Inphi Corporation, Santa Clara, CA (US)

( * ) Notice: Subject to any disclaimer, the term of this patent is extended or adjusted under 35 U.S.C. 154(b) by 193 days.

(21) Appl. No.: 13/909,489

(22) Filed: Jun. 4, 2013

(51) Int. Cl.
*G06F 12/00* (2006.01)
*G11C 7/10* (2006.01)
*G11C 5/10* (2006.01)
*G06F 11/27* (2006.01)

(52) U.S. Cl.
CPC .............. *G11C 7/1072* (2013.01); *G06F 11/27* (2013.01); *G11C 5/10* (2013.01)
USPC ............... 711/105; 711/5; 714/718; 714/733; 714/30; 365/17

(58) Field of Classification Search
None
See application file for complete search history.

(56) References Cited

U.S. PATENT DOCUMENTS

| 2004/0123018 | A1* | 6/2004 | Miller et al. | 711/100 |
| 2008/0133993 | A1* | 6/2008 | Crop et al. | 714/733 |
| 2014/0229666 | A1* | 8/2014 | Schoenborn et al. | 711/105 |

* cited by examiner

*Primary Examiner* — Matthew Bradley
*Assistant Examiner* — Alan Otto
(74) *Attorney, Agent, or Firm* — Richard T. Ogawa; Ogawa P.C.

(57) ABSTRACT

Techniques for processing signal information from a high speed communication bus. The techniques includes determining spatial regions on an eye characterized by a start point, an end point, a middle point, a left point, and a right point. The start point is a beginning of an eye opening at a reference voltage. The end point is at an ending of eye opening at the reference voltage. The middle point is at a center point of eye opening at the reference voltage. The left point is a left sampling location characterized by a minimum setup time requirement, and the right point is a right sampling location characterized by a minimum hold time requirement. Determining the points is based on shifting a DQS position and a DQ position and running a plurality of memory built-in self test (BIST) engines and a plurality of results of BIST tests.

22 Claims, 10 Drawing Sheets

One CPU has 4 memory controllers which drive 4 memory channels

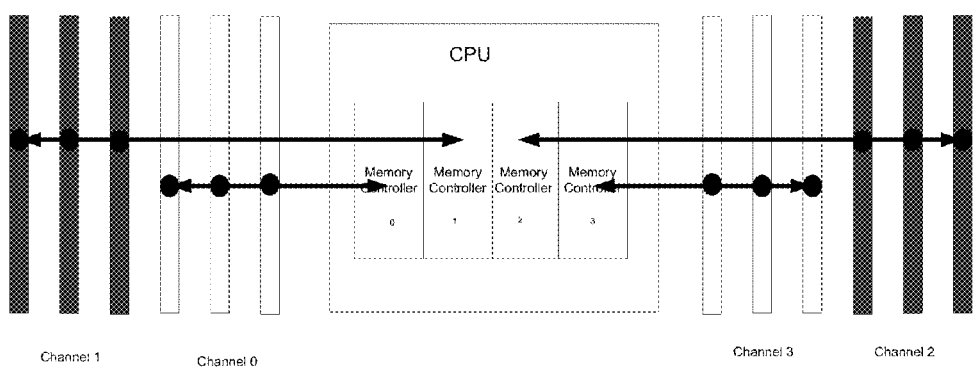
Figure 1: One CPU has 4 memory controllers which drive 4 memory channels

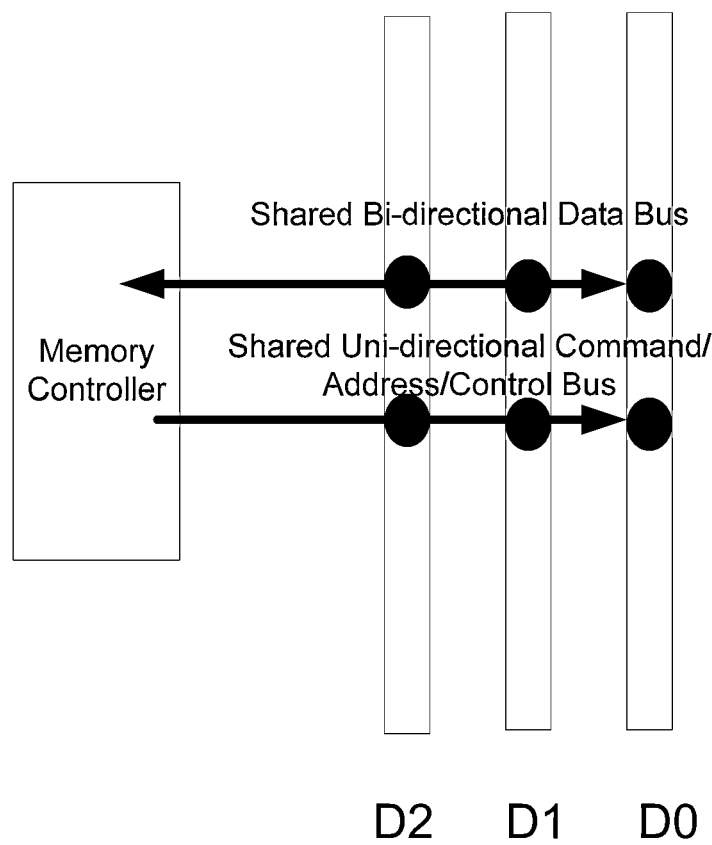
Figure 2: Shared bus among 3 memory modules D2, D1 and D0

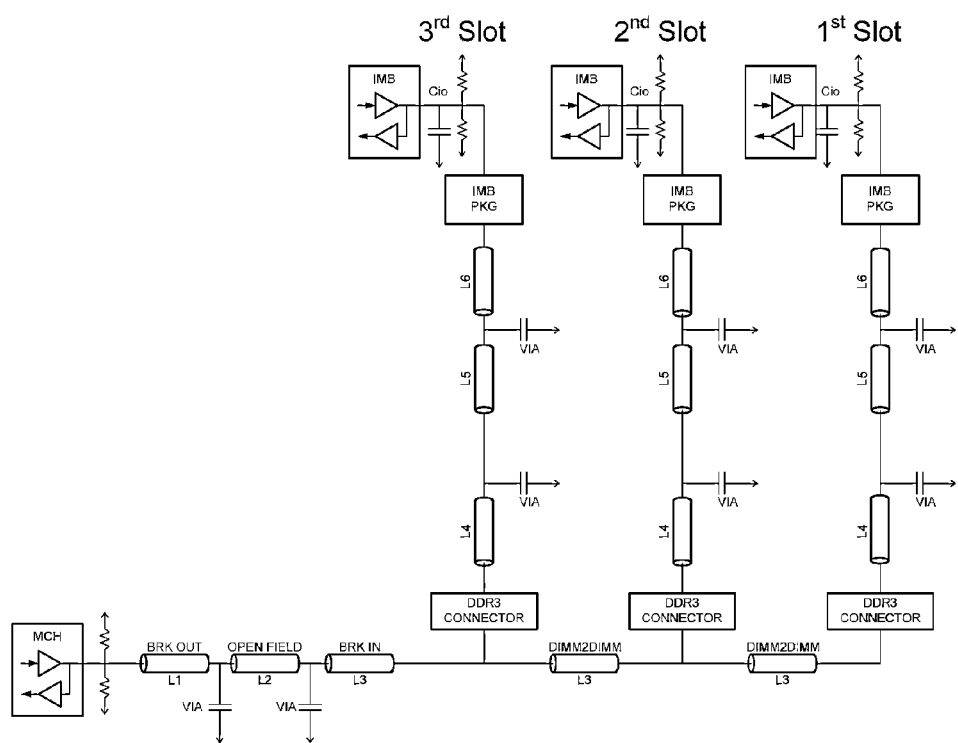
Figure 3. 3DPC Memory Channel

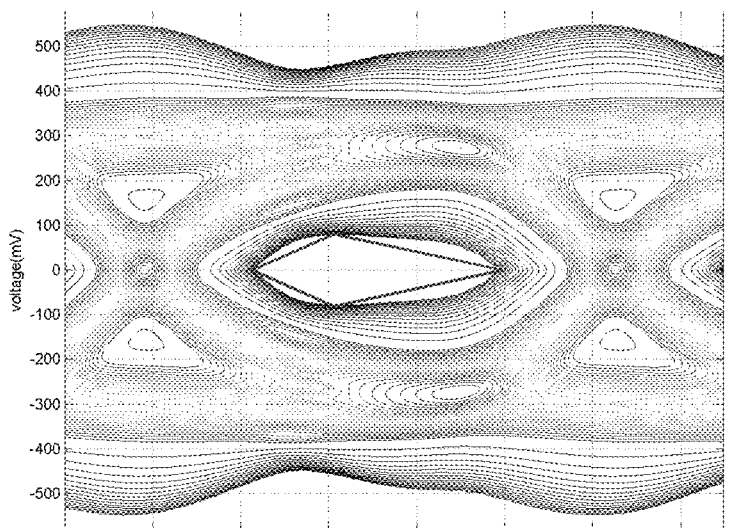
Figure 4. A distorted Eye Shifted to the Left
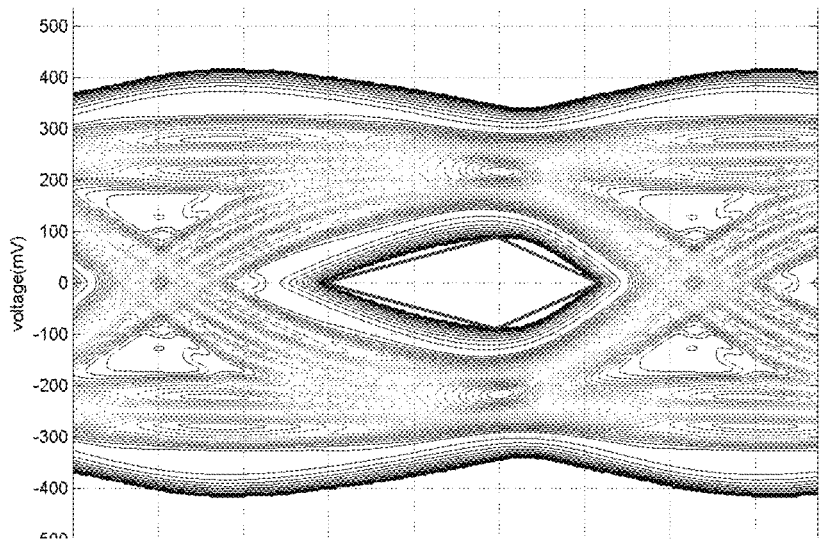
Figure 5. A distorted Eye Shifted to the Right

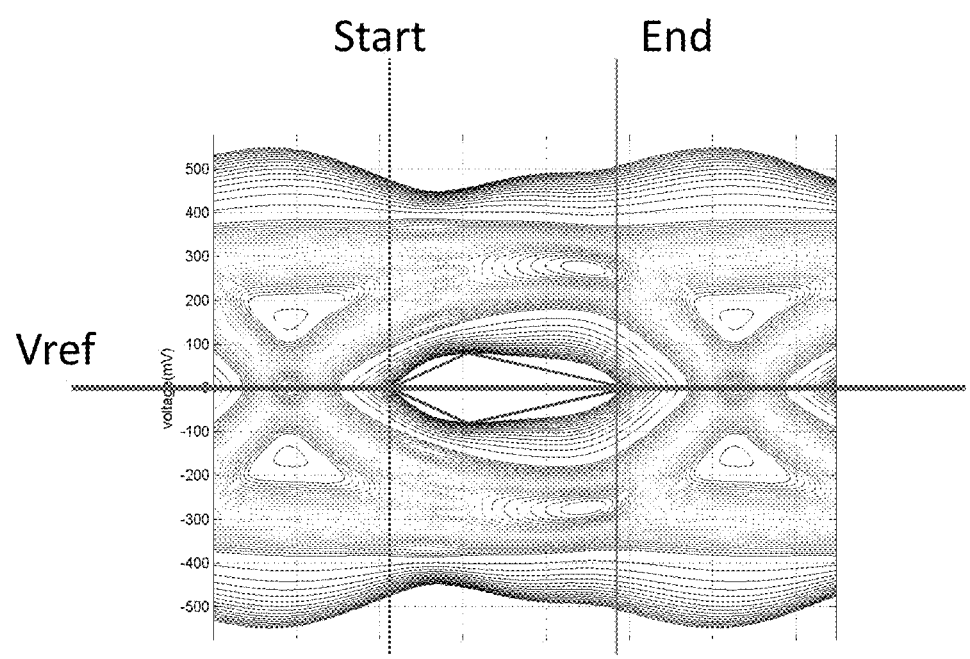
Figure 6. Find Eye Opening at Vref Level

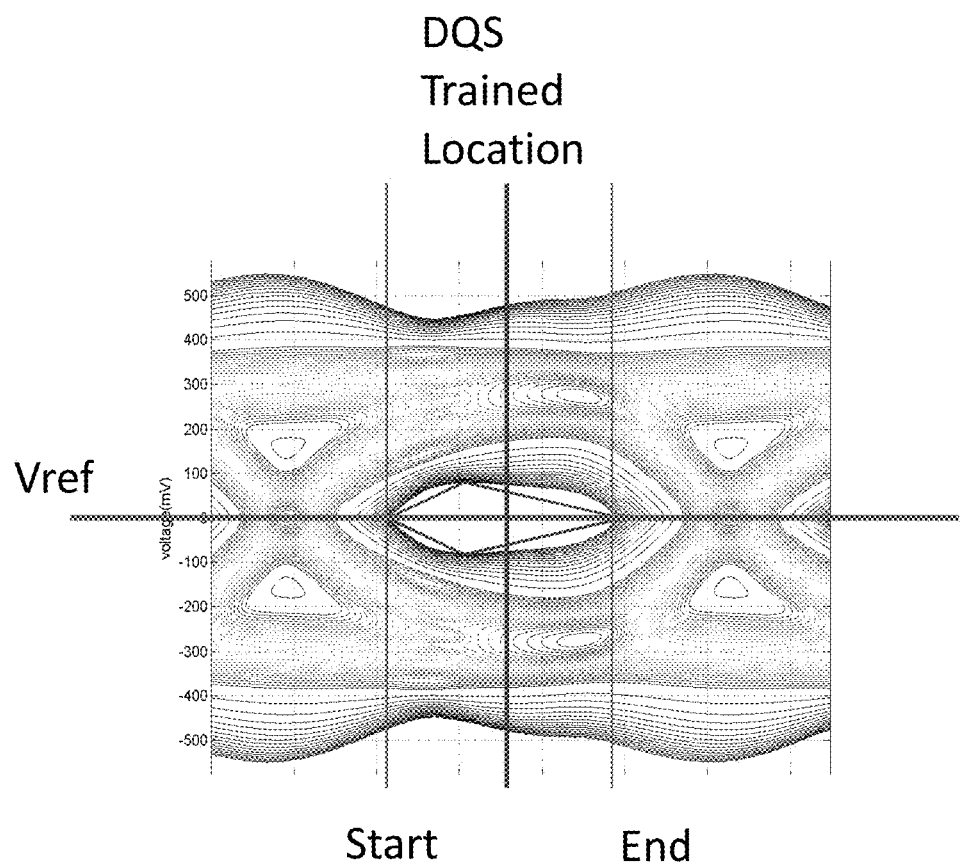
Figure 7. Set the Trained Location in the middle of Eye Opening

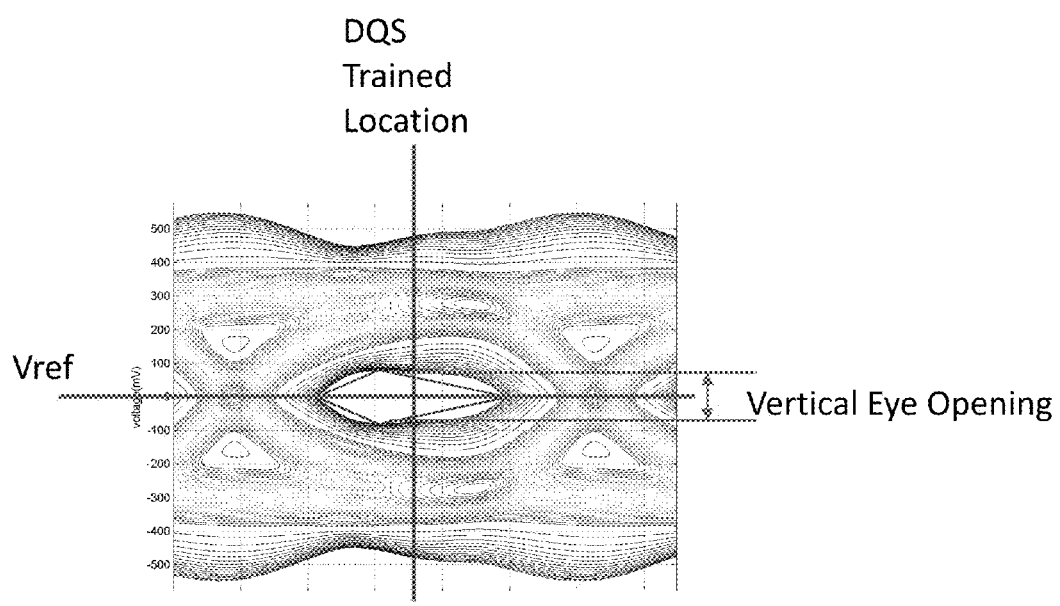
Figure 8. Set the Trained Location in the middle of Eye Opening

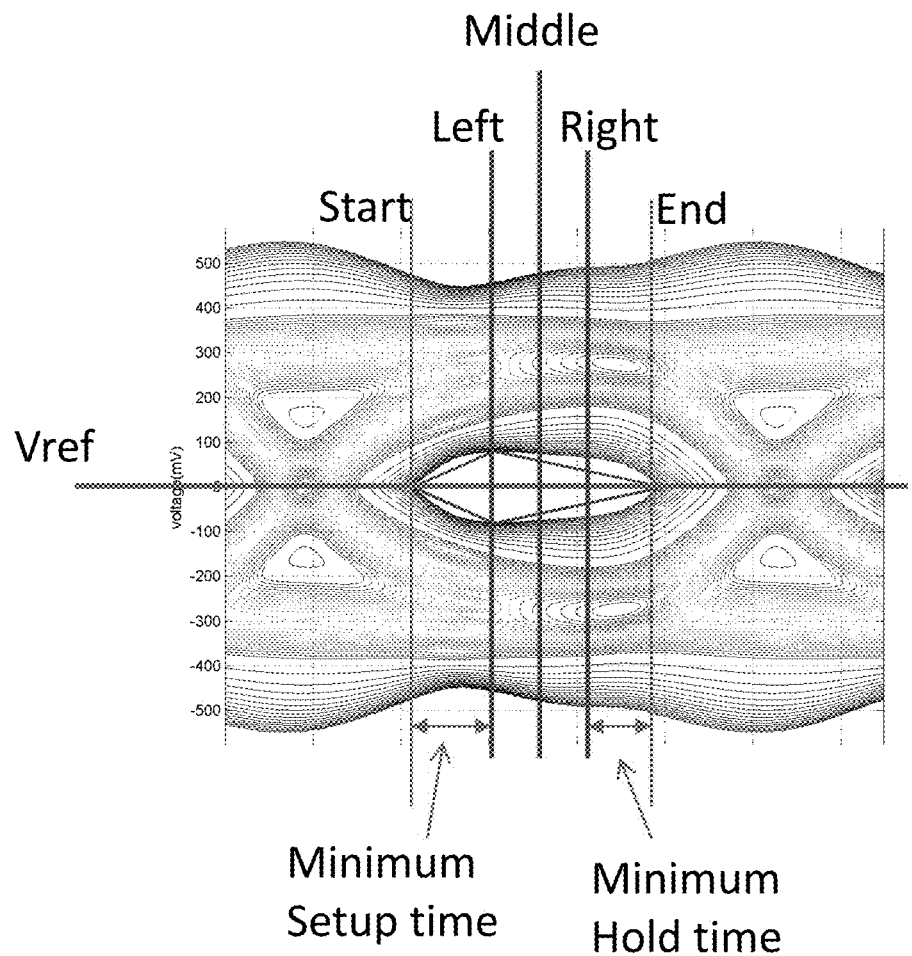
Figure 9. Pick Left, Middle and Right Three Sampling Points

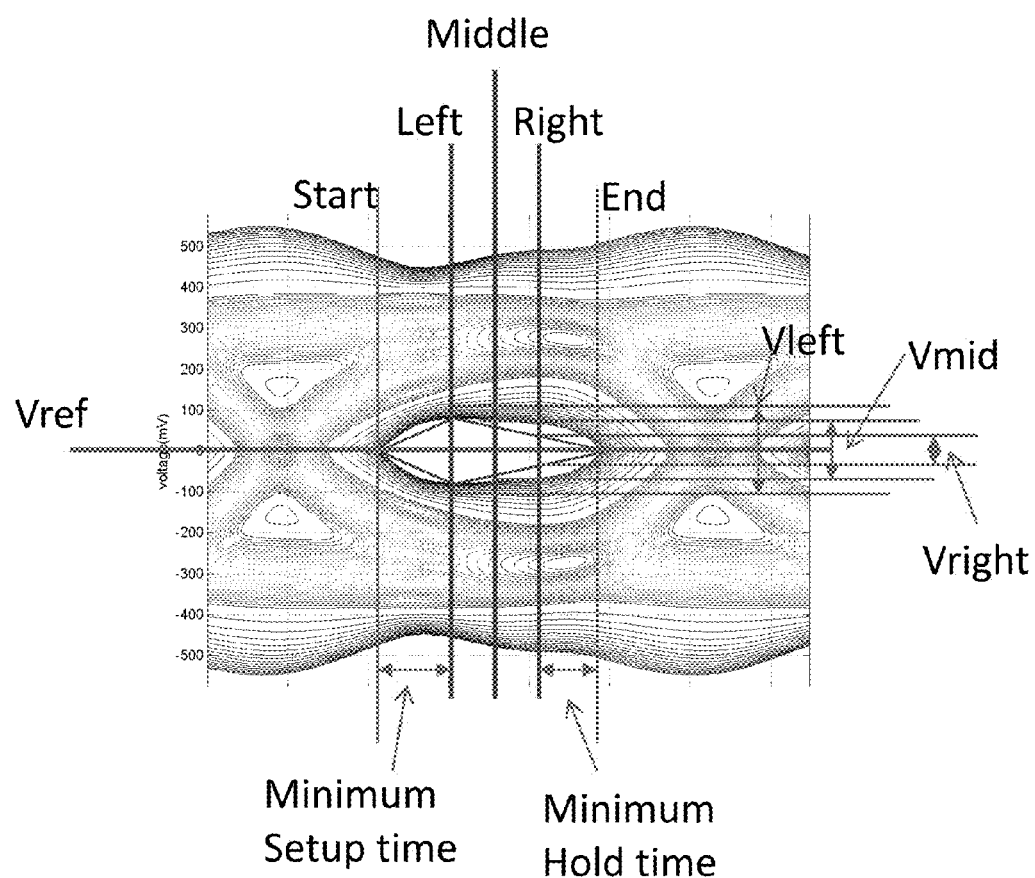
Figure 10. Measure Vertical Eye Opening at Three Sampling Points

EYE SCAN FOR ASYMMETRIC SHAPED COMMUNICATION SIGNAL

CROSS-REFERENCE TO RELATED APPLICATIONS

N/A

BACKGROUND OF THE INVENTION

The present invention relates to computing techniques. More particularly, the present invention provides a plurality of memory devices configured with a memory controller using a common interface bus having multiple signals. In other examples where a memory controller controls multiple memory devices, interface devices are often deployed to improve the quality of the signal transmissions between the memory controller and the memory devices. As an example, DDR3, and DDR4 Registered memory modules use one or more registers to buffer and re-drive the command, control and address signals from the host memory controller to multiple DDR3 and DDR4 SDRAM devices. DDR3, and DDR4 Load Reduction DIMM memory modules use memory buffer to buffer and re-drive the data, command, control and address signals from the host memory controller to multiple DDR3 and DDR4 SDRAM devices.

High-speed digital signals, such as the data, clock and control signals that are conveyed between a host controller and a memory module, are typically received by a respective receiver circuits. The host controller often couples to a memory controller, which is configured with multiple dual inline memory modules, commonly called "DIMMs," via a common interface. As the signals become faster, signal integrity becomes more important, and more difficult to operate and monitor efficiently.

From the above, it is seen that techniques for improving memory module devices and methods of use are highly desirable.

BRIEF SUMMARY OF THE INVENTION

The present invention relates to computing techniques. More particularly, the present invention provides a plurality of memory devices configured with a memory controller using a common interface bus having multiple signals. In other examples where a memory controller controls multiple memory devices, interface devices are often deployed to improve the quality of the signal transmissions between the memory controller and the memory devices. As an example, DDR3 and DDR4 Registered memory modules use one or more registers to buffer and re-drive the command, control and address signals from the host memory controller to multiple DDR3 and DDR4 SDRAM devices. DDR3, and DDR4 Load Reduction DIMM memory modules use memory buffer to buffer and re-drive the data, command, control and address signals from the host memory controller to multiple DDR3 and DDR4 SDRAM devices.

In an example, the present invention provides a method of operating a memory system during a memory initialization process to train a position between a data signal with a strobe signal at a receiver location of one of a plurality of DIMM modules. The method includes transferring information between a memory controller coupled to a CPU of a host computer to and from multiple DIMM modules using a common bi-direction data bus. In an example, the bi-directional data bus is coupled between a data interface from the memory controller to multiple memory interfaces coupled to the DIMM modules. The method includes communicating address information and control information from the memory controller to one or more of the multiple DIMM modules using a uni-directional command/address/control bus configured between the memory controller and the multiple DIMM modules. The method includes writing information to one of the DIMM modules by transferring data from the memory controller to the DIMM module using the common bi-directional interface data bus, and causing a signal propagation from the writing of the information to the DIMM module to other DIMM modules sharing the common bi-directional interface data bus. The method includes subjecting an interface of a target DIMM module to a reflection caused by the signal propagation from other DIMM modules sharing the common bi-directional data bus to cause an introduction of distortion into a shape of an eye characterizing a signal at the receiver of the target DIMM module. The method reads information from one of DIMM modules by transferring data from the one DIMM module to the memory controller using the common bi-directional interface data bus and causes a signal propagation from the reading of the information from the one DIMM module to other DIMM modules sharing the same data bus. The method includes subjecting the interface of the target DIMM module to a reflection caused by the signal propagation from other DIMM modules sharing the common bi-directional data bus to cause an introduction of distortion into a shape of an eye characterizing a signal at the receiver of memory controller interface.

In an example, the method includes determining spatial regions on the eye characterized by a start point, an end point, a middle point, a left point, and a right point. In an example, the start point is a beginning of an eye opening at a reference voltage. In an example, the end point is at an ending of eye opening at the reference voltage. In an example, the middle point is at a center point of eye opening at the reference voltage. In an example, the left point is a left sampling location characterized by a minimum setup time requirement, and the right point is a right sampling location characterized by a minimum hold time requirement. In an example, the determining of the points is based on shifting a DQS position and a DQ position and running a plurality of memory built-in self test (BIST) engines and a plurality of results of BIST tests. In an example, the method includes identifying a V reference corresponding to a center reference voltage for the signal representing the eye and identifying a Vleft reference corresponding to the left point for the eye based on the shifting of a reference voltage level and the running memory built-in self test (BIST) engines and the results of BIST tests. The method includes identifying a Vright reference corresponding to the right point for the eye based on the shifting of a reference voltage level and the running memory built-in self test (BIST) engines and the results of BIST tests and identifying a V middle reference corresponding to the middle point for the eye based on the shifting the reference voltage level and the running memory built-in self test (BIST) engines and the results of BIST tests.

In an example, the method includes determining spatial regions on the eye characterized by a start point, an end point, a middle point, a left point, and a right point. In an example, the start point is a beginning of an eye opening at a reference voltage. In an example, the end point is at an ending of eye opening at the reference voltage. In an example, the middle point is at a center point of eye opening at the reference voltage. In an example, the left point is a left sampling location characterized by a minimum setup time requirement, and the right point is a right sampling location characterized by a minimum hold time requirement. In an example, the determining of the points is based on shifting a DQS position and a DQ position and running a plurality of memory built-in self test (BIST) engines and a plurality of results of BIST tests. In an example, the method includes identifying a V reference corresponding to a center reference voltage for the signal representing the eye and identifying a Vleft reference corresponding to the left point for the eye based on the shifting of a reference voltage level and the running memory built-in self test (BIST) engines and the results of BIST tests.

Benefits are achieved over conventional techniques. In an embodiment, the benefit of allowing a memory system for eye scan of an asymmetric shaped eye caused by high speed data over a common interface bus. In an example, an optimum or desired sampling location can be identified by using this fast eye scan technique. Optimum or desired sampling increases the system signal margins and allows the system to tolerate more noise and improves the reliability. System can populate more memory modules and increase the system memory capacity. For example, 3DPC, 1333 configuration can be enabled on system by using fast eye and increase the 2 CPUs system memory capacity from 512 GB to 768 GB. This technique also enables system to run at the faster speed and increase the throughputs and hence increases the system memory performance such as bandwidth. For example, 2DPC configuration can run at 1866 MT/S instead of 1600 MT/S. Combinations or a variety of DIMM modules can also be implemented. Depending upon the specific embodiment, one or more of these benefits may be achieved. Of course, there can be other variations, modifications, and alternatives.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 1 is a simplified block diagram of a memory system according to an embodiment of the present invention.

FIG. 2 is a simplified diagram of a memory module according to an embodiment of the present invention.

FIG. 3 is a simplified diagram of a memory channel according to an embodiment of the present invention.

FIG. 4 is a simplified illustration of an eye scan having a distorted eye shifted in a first direction according to an embodiment of the present invention.

FIG. 5 is a simplified illustration of an eye scan having a distorted eye shifted in a second direction according to an embodiment of the present invention.

FIGS. 6 through 8 are simplified illustrations of eye scans according to an embodiment of the present invention.

FIGS. 9 through 11 are simplified illustrations of eye scans according to an embodiment of the present invention.

DETAILED DESCRIPTION OF THE INVENTION

Figure 11:
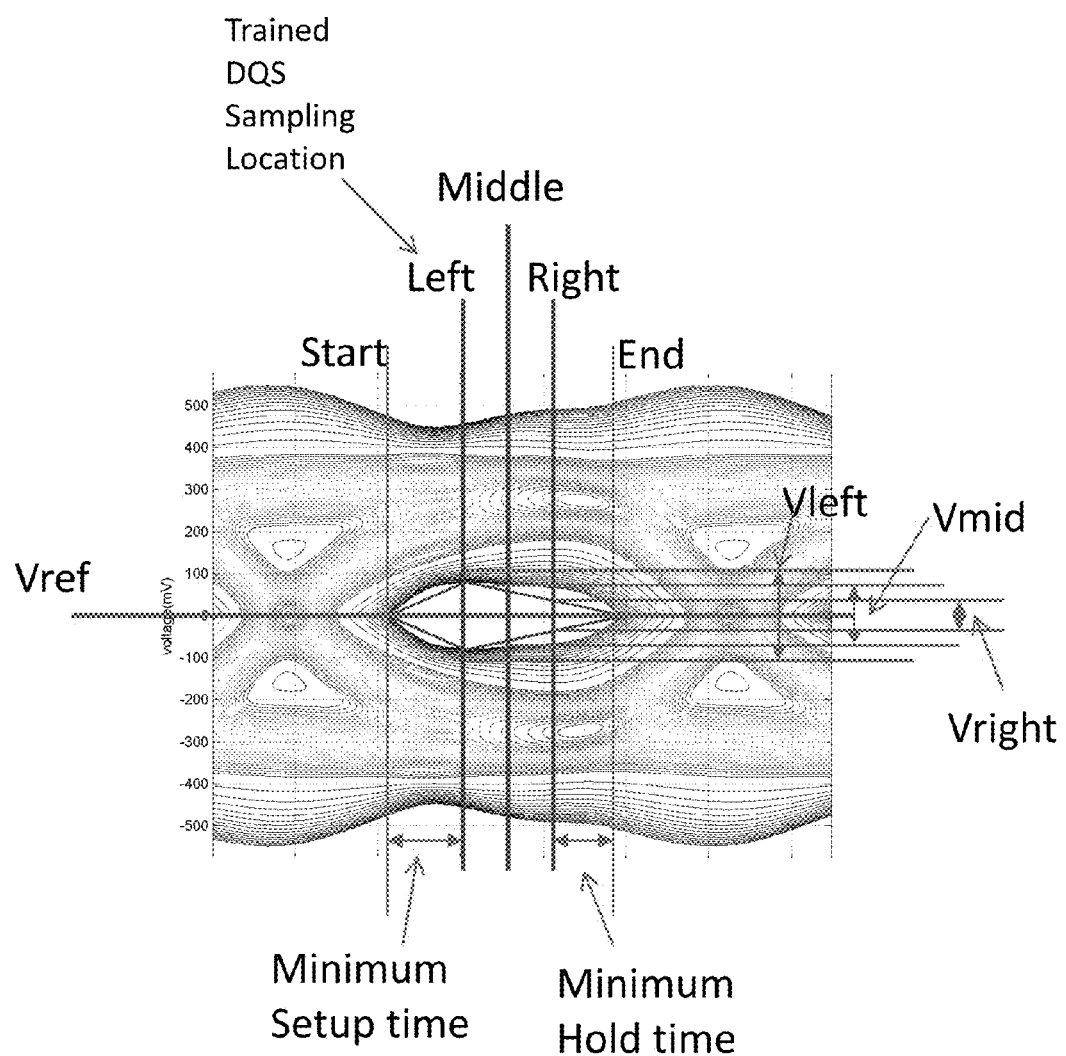

This present invention relates to memory storage systems and devices. More particularly, the present invention provides a memory system and a method of operating a memory system and a memory buffer device. Merely by way of example, the invention has been provided for the application of DDR3 and DDR4 SDRAM devices, but it would be recognized that the methods described herein can be applied to other memory storage systems and the like. Additionally, such memory storage systems can be used for a variety of applications such as network and/or computer storage systems, computer servers, hand held computing devices, portable computing devices, computer systems, network appliances and/or switches, routers, and gateways, and the like.

FIG. 1 is a simplified block diagram of a memory system according to an embodiment of the present invention. In server memory system, one CPU can have multiple memory controllers to increase memory capacity. For example, in FIG. 1, one CPU has 4 memory controllers, which drive 4 memory channels. Each memory controller drives multiple memory DIMM modules. For example, in FIG. 1, each memory controller drives 3 DIMM modules.

FIG. 2 is a simplified diagram of a memory module according to an embodiment of the present invention. In each memory channel, all data bus and command/address/control bus are shared among multiple memory modules. For example, in FIG. 2, the data bus and command/address/control bus are shared among three (3) memory modules D2, D1, and D0. The shared data bus creates challenge for the signal transmitted on the bus. In an example, the extra stubs on the bus create the reflections, which will change the signal shape and cause difficulty for the receiver to receive the data correctly, especially when data rate is increased to DDR3 and DDR4 speed range.

FIG. 3 is a simplified diagram of a memory channel according to an embodiment of the present invention. For example, a 3DPC configuration channel is shown in term of transmission lines and discontinuities caused by the capacitors such as vias, silicon I/O caps, etc. in FIG. 3. From the channel diagram in FIG. 3, we can see that the 3DPC memory channel is in daisy-chain structure and use multi-drop bus, which introduces discontinuities at each DIMM connector. From the principle of signal transmission along the transmission lines, each discontinuity will introduce signal reflection and hence distort the signal quality at the receiver.

On each DIMM, there is an extra stub from the DIMM connector gold finger to the memory buffer receiver. This extra stub introduces a large discontinuity at DIMM connector and hence causes reflections.

For example, when writing to DIMM2, the signal also propagates to DIMM1 and DIMM0. The reflections coming from DIMM1 and DIMM0 plus the reflections from the DIMM2 memory buffer are combined together and distort the eye shape at the receiver of DIMM2. The net effect of the distortion from the refection is the eye-shape is not symmetric around the middle of the eye opening. The largest vertical eye opening is either shifted to the left or right depending on the channel reflections. Two typical eye diagrams are shown in FIG. 4 and FIG. 5. FIG. 4 shows an eye distorted to the left and FIG. 5 shows an eye distorted to the right. As shown, FIG. 4 is a simplified illustration of an eye scan having a distorted eye shifted in a first direction according to an embodiment of the present invention. As shown, FIG. 5 is a simplified illustration of an eye scan having a distorted eye shifted in a second direction according to an embodiment of the present invention.

In a memory system, the data signal (DQ) is sampled with strobe signal (DQS) at the receiver of a DIMM device. During the memory initialization stage of a computing system, the Basic Input and Output System, commonly called "BIOS,"

trains a spatial position between DQ and DQS and the BIOS finds the best or desirable location for DQS to sample the DQ. In an example, the BIOS trains the location of DQS relative to DQs follows, in reference to the Figures:

1. Find the eye opening at the reference voltage level (horizontal line) by identifying Start and End point, as shown in FIG. 6;
2. Pick the center point between Start and End and set as the DQS sampling location, as shown in FIG. 7.

As shown, by selecting the middle of eye opening, the vertical eye opening at the sampling point is not the maximum due to the asymmetrical eye shape. Such selection leads to a reduction in system margins, as depicted in FIG. 8. Ideally, it is desirable to scan the 2-D eye and identify the sampling location to achieve the best vertical and horizontal eye opening, that is, the maximum spatial region in each of the vertical and horizontal spatial regions of the eye. Unfortunately, 2-D eye scan often takes long time and impact the system boot time performance, which leads to inefficiencies.

In an example, the present disclosure provides techniques, including a fast eye scan training scheme designed to achieve better vertical eye opening and also at the same time to meet the horizontal eye opening requirement. As shown, the fast training scheme can be done within one second for 32 GB memory module. In an example, the scheme is as follows:

1. Find the eye opening at the reference voltage level by identifying Start and End point, as shown in FIG. 6;
2. Determine the Left, Middle and Right sampling points based on horizontal eye opening requirements, as shown in FIG. 9;
   Left is picked to meet the minimum setup time requirement on the system.
   Right is picked to meet the minimum hold time requirement on the system.
   Middle is picked at the center of the eye opening.
3. Measure the vertical eye opening at Left, Middle and Right sampling locations, as illustrated in FIG. 10.
   Vleft is the vertical eye opening at sampling point Left.
   Vmid is the vertical eye opening at sampling point Middle.
   Vright is the vertical eye opening at sampling point Right.
4. Set the trained sampling point based on Vleft, Vmid and Vright values;
5. Set the DQS sampling point at the max(Vleft, Vmid, Vright).

In an example, asymmetric eye shape is very common on memory system, especially at high speed. The reflections in the channel distort the eye and cause the maximum eye opening off the center of eye opening. Above algorithm picks three locations in horizontal direction and measures the vertical eye opening. In above step 5, the maximum vertical eye opening is identified and the sampling location is set at this point to achieve the maximum signal margins. The training time is not dramatically affected by only selecting three locations. This algorithm not only guarantees the sampling location meet the horizontal setup and hold time requirements, but also achieves the best vertical voltage margins which is critical for the noise tolerance on the system.

In an example, the eye scan algorithm can be implemented in the memory interface chip, memory device, memory controller. It usually needs Basic Input and Output System, common called "BIOS" assistance. During the system initialization, memory controller and memory devices negotiate with each other and determine the memory timing settings. This process is usually called memory interface training. This process is controlled by the memory reference code in the BIOS. The fast eye scan can be performed during the memory training process and implemented the training algorithms in the memory reference codes. During the training, the sampling strobe (DQS) signal is shifted relatively to the data signal (DQ) by the transmitter or receiver with a fractional step of a clock cycle (for example, $1/128^{th}$ of clock cycle). Then memory reference code will enable the memory controller memory built-in self test logics (BIST). This process is continued until one data unit interval is swept by the data strobe (DQS). By doing this, memory reference code will determine the eye opening by checking the memory BIST test results. For a fixed position between data strobe signal (DQS) and data signal (DQ), memory reference code will adjust the reference voltage of the receiver and then start the memory BIST test to determine the vertical eye opening. Memory reference code first shifts the reference voltage up from the default voltage level by a small voltage step (for example, 5 mV) and do a memory BIST test and record the test result. Memory reference code continues shifts the reference voltage up until the memory BIST test failure. This indicates the top of the opening eye in vertical direction. Next memory reference code shifts the reference voltage level down from the default voltage level by a small voltage step (for example, 5 mV) and until the memory BIST test fail. This indicates the bottom of the opening eye in vertical direction. By doing so, memory reference code can determine the vertical eye opening at a fixed sampling point.

As shown, the system includes a motherboard including a central processing unit (CPU) coupled to three DIMM connector slots. In an embodiment, the CPU has one memory controller, but can include multiple memory controllers. The memory controller shown has three DIMM slots, but the memory controller can have more than three slots. In this embodiment, each of the DIMM modules includes a memory buffer. However, those of ordinary skill in the art will recognize other variations, modifications, and alternatives.

In an example, the memory module, or DIMM module, includes a plurality of storage devices, such as DRAM devices, flash memory devices, and the like. In an embodiment, the DIMM module also includes a memory buffer device, which can include a single chip or multiple chips. This DIMM module having the memory buffer can be used in the DIMM slots shown in the memory system block diagram. Those of ordinary skill in the art will recognize other variations, modifications, and alternatives.

In an example, the memory buffer interface includes a memory buffer iSC, which is coupled to a plurality of DRAMs, a SATA FLASH controller, and a DIMM edge connector. In this embodiment, the SATA FLASH controller is also coupled a plurality of FLASH modules and can have a 2.1 Gbps data read speed and a 2.1 Gbps data write speed.

In a specific embodiment, the memory buffer interface can include a DDR-1600 interface between the memory buffer iSC and the plurality of DRAMs with a data transfer speed of greater than 115 Gbps. The memory buffer can also include a SATA-II interface between the memory buffer iSC and the SATA FLASH controller with a data transfer speed of 2.4 Gbps. Also, the memory buffer iSC and the DIMM edge connector can include an ADR pin167 connection. Of course, there can be other variations, modifications, and alternatives.

In an example, the system includes a motherboard including a central processing unit (CPU) coupled to two memory buffers on the motherboard. Each of the memory buffers is coupled to two DIMM slots. Each of these DIMM slots can be applied with regular standard DIMM module.

In an embodiment, the CPU has one memory controller, but can include multiple memory controllers. The memory controller shown is coupled to two memory buffers, but can be coupled to more than two memory buffers. Each of the memory buffers shown is coupled to two DIMM slots, but each buffer can have more than two DIMM slots. In this embodiment, each of the memory buffers is configured on the motherboard. However, those of ordinary skill in the art will recognize other variations, modifications, and alternatives.

In an example, the buffer chip shown can represent the memory buffers any buffer chips. In an example, the buffer chip includes a storage controller. Again, there can be other variations, modifications, and alternatives.

In an example, the DRAM device includes a command/address receiver, a command decoder, a bank decoder, a column decoder, a plurality of banks, an I/O gating data mask, a read & write FIFO, an output DQ driver, and an input DQ receiver.

In an example, the plurality of banks is shown to have banks numbered from 0-7, but can have more banks. Each of the banks includes a row decoder, sense amplifiers, and a DRAM array. In an embodiment, the command receiver and decoder receives a command and address input and outputs signals to the bank decoder, the column decoder, and the row decoder of the plurality of banks. The sense amplifiers and the column decoder are coupled to the I/O gating data mask, which is coupled to the read & write FIFO. The FIFO is coupled to the input DQ receiver and the output DQ driver.

In a specific embodiment, the bus connecting the sense amplifiers and the I/O gating data mask can have a row width of 8192. Also, the bus between the I/O gating data mask can have an 8×10 width with a ⅛ data rate. For example, the bus can be 64 bits wide with a 200 MT/s data rate. The input and output DQ can be full 10 width with full data rates, which can be 8 bits wide with a data date of 1600 MT/s. Of course, there can be other variations, modifications, and alternatives.

In an example, the present method and system have variations. As an example, the transferring of information is provided at a data rate of 1333 MT/S, 1600 MT/S, 1866 MT/S, 2133 MT/S or above. In an example, the writing of data is provided during a BIOS operation. In an example, communicating is provided at a data rate of up to 1600 MBPS on the unidirectional command/address/control bus In an example, transferring information at a data rate of up to 3200 MBPS on the bi-directional data bus. In an example, the memory controller and the plurality of DIMM devices are configured on a common substrate member. In an example, the start and the left point is characterized by a minimum set up time; and wherein the right point and the end are characterized by a minimum hold time. In an example, the left point is characterized as a trained sampling location or the right point is characterized as a trained sampling point. In an example, the method includes determining a DQS sampling point at a spatial location characterized by a maximum vertical voltage among Vleft, Vmiddle, Vright. In an example, the determining of the voltage Vleft at left point during a training process, the determining of the voltage Vright at right point during a training process, or the determining the voltage Vmiddle at the center point during a training process. In an example, the left point is based on a minimum setup time. In an example, the right point is based on a minimum hold time. In an example, the method further includes using a plurality of sampling points to determine a maximum vertical eye opening of asymmetric eye shape, using a system BIOS to find a maximum vertical eye, using the memory built-in self test to perform a memory test identifying the eye opening, or using shifting reference voltage to measure the vertical eye opening, or using a shifting DQS position and a DQ position to measure horizontal eye opening, any of which can be alone or in combination with any others. In an example, the memory system is provided in one of a network appliance, a computer storage systems, a computer server, a hand held computing device, a portable computing device, a switch, a router, or a gateway. Of course, there can be variations.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of operating a memory system during a memory initialization process to train a position between a data signal with a strobe signal at a receiver location of one of a plurality of DIMM devices, the method comprising:

transferring information between a memory controller coupled to a CPU of a host computer to and from a least three DIMM devices numbered from DIMM D0, DIMM D1, and DIMM D2 using a common bi-direction data bus, the bi-directional data bus being coupled between a data interface from the memory controller to a D0 data interface, a D1 data interface, and a D2 data interface;

communicating address information and control information from the memory controller to one or more of the three DIMM devices numbered from DIMM D0, DIMM D1, and DIMM D2 using a uni-directional command/address/control bus configured between the memory controller and the three DIMM devices;

writing information to D2 by transferring data from the memory controller to D2 using the common bi-directional interface data bus;

causing a signal propagation from the writing of the information to D2 to either or both D1 or D0;

subjecting the D2 interface to a reflection caused by the signal propagation from either or both D0 or D1 to cause an introduction of distortion into a shape of an eye opening characterizing a signal at the receiver of D2;

reading information from one of DIMM modules by transferring data from the DIMM module to the memory controller using the common bi-directional interface data bus;

causing a signal propagation from the reading of the information from the DIMM module to one or more of the other DIMM modules sharing the same common bi-directional data bus;

subjecting the D2 data interface to a reflection caused by the signal propagation from one or more of the other DIMM modules sharing the same common bi-directional data bus to cause an introduction of distortion into a shape of the eye opening characterizing a signal at the receiver of memory controller interface;

determining spatial regions on the eye opening characterized by a start point, an end point, a middle point, a left point, and a right point, the start point being at a spatial beginning of the eye opening at a reference voltage, the end point being at a spatial ending of the eye opening at the reference voltage, the middle point being at a spatial center point of the eye opening at the reference voltage, the left point being at a spatial sampling location that is characterized by a minimum setup time, the right point being at a spatial sampling location that is characterized by a minimum hold time, whereupon the determining comprising shifting a DQS position and a DQ position and running memory built-in self test (BIST) engines and the results of BIST tests;

identifying a V reference corresponding to a center reference voltage for the signal representing the eye;
identifying a Vleft reference corresponding to the left point for the eye based on shifting the reference voltage level and running memory built-in self test (BIST) engines and the results of BIST tests;
identifying a Vright reference corresponding to the right point for the eye based on shifting the reference voltage level and running memory built-in self test (BIST) engines and the results of BIST tests;
identifying a V middle reference corresponding to the middle point for the eye based on shifting the reference voltage level and running memory built-in self test (BIST) engines and the results of BIST tests.

2. The method of claim 1 wherein the DIMM device is a DDR3 or DDR 4.

3. The method of claim 1 wherein transferring is provided at a data rate of 1333 MT/S, 1600 MT/S, 1866 MT/S, 2133 MT/S or above.

4. The method of claim 1 wherein the writing is provided during a BIOS operation.

5. The method of claim 1 wherein the communicating is provided at a data rate of up to 1600 MBPS on the unidirectional command/address/control bus.

6. The method of claim 1 wherein the transferring information at a data rate of up to 3200 MBPS on the bi-directional data bus.

7. The method of claim 1 wherein the memory controller and the plurality of DIMM devices are configured on a common substrate member.

8. The method of claim 1 wherein the start and the left point is characterized by a minimum set up time; and
wherein the right point and the end are characterized by a minimum hold time.

9. The method of claim 1 wherein the left point is characterized as a trained sampling location or the right point is characterized as a trained sampling point.

10. The method of claim 1 further comprising determining a DQS sampling point at a spatial location characterized by a maximum vertical voltage among Vleft, Vmiddle, Vright.

11. The method of claim 10 wherein the determining of the voltage Vleft at left point during a training process.

12. The method of claim 10 wherein the determining of the voltage Vright at right point during a training process.

13. The method of claim 10 wherein determining the voltage Vmiddle at the center point during a training process.

14. The method of claim 1 wherein the left point is based on a minimum setup time.

15. The method of claim 1 wherein the right point is based on a minimum hold time.

16. The method of claim 1 further comprising using a plurality of sampling points to determine a maximum vertical eye opening of asymmetric eye shape.

17. The method of claim 1 further comprising using a system BIOS to find a maximum vertical eye.

18. The method of claim 1 further comprising using the memory built-in self test to perform a memory test identifying the eye opening.

19. The method of claim 1 further comprising using shifting reference voltage to measure the vertical eye opening.

20. The method of claim 1 further comprising using a shifting DQS position and a DQ position to measure horizontal eye opening.

21. The method of claim 1 wherein the memory system is provided in one of a a network appliance, a computer storage systems, a computer server, a hand held computing device, a portable computing device, a switch, a router, or a gateway.

22. A method of operating a memory system during a memory initialization process to train a position between a data signal with a strobe signal at a receiver location of one of a plurality of DIMM modules, the method comprising:
transferring information between a memory controller coupled to a CPU of a host computer to and from multiple DIMM modules using a common bi-direction data bus, the bi-directional data bus being coupled between a data interface from the memory controller to multiple memory interfaces coupled to the DIMM modules;
communicating address information and control information from the memory controller to one or more of the multiple DIMM modules using a uni-directional command/address/control bus configured between the memory controller and the multiple DIMM modules;
writing information to one of the DIMM modules by transferring data from the memory controller to the DIMM module using the common bi-directional interface data bus;
causing a signal propagation from the writing of the information to the DIMM module to other DIMM modules sharing the common bi-directional interface data bus;
subjecting an interface of a target DIMM module to a reflection caused by the signal propagation from other DIMM modules sharing the common bi-directional data bus to cause an introduction of distortion into a shape of an eye characterizing a signal at the receiver of the target DIMM module;
reading information from one of DIMM modules by transferring data from the one DIMM module to the memory controller using the common bi-directional interface data bus;
causing a signal propagation from the reading of the information from the one DIMM module to other DIMM modules sharing the same data bus;
subjecting the interface of the target DIMM module to a reflection caused by the signal propagation from other DIMM modules sharing the common bi-directional data bus to cause an introduction of distortion into a shape of an eye characterizing a signal at the receiver of memory controller interface
determining spatial regions on the eye characterized by a start point, an end point, a middle point, a left point, and a right point, the start point being a beginning of an eye opening at a reference voltage, the end point being at an ending of eye opening at the reference voltage, the middle point being at a center point of eye opening at the reference voltage, the left point being a left sampling location characterized by a minimum setup time requirement, and the right point being a right sampling location characterized by a minimum hold time requirement;
whereupon the determining based on shifting a DQS position and a DQ position and running a plurality of memory built-in self test (BIST) engines and a plurality of results of BIST tests;
identifying a V reference corresponding to a center reference voltage for the signal representing the eye;
identifying a Vleft reference corresponding to the left point for the eye based on the shifting of a reference voltage level and the running memory built-in self test (BIST) engines and the results of BIST tests;
identifying a Vright reference corresponding to the right point for the eye based on the shifting of a reference voltage level and the running memory built-in self test (BIST) engines and the results of BIST tests; and
identifying a V middle reference corresponding to the middle point for the eye based on the shifting the reference voltage level and the running memory built-in self test (BIST) engines and the results of BIST tests.

* * * * *